United States Patent
Arai et al.

[11] Patent Number: 5,821,560
[45] Date of Patent: Oct. 13, 1998

[54] THIN FILM TRANSISTOR FOR CONTROLLING A DEVICE SUCH AS A LIQUID CRYSTAL CELL OR ELECTROLUMINESCENT ELEMENT

[75] Inventors: Michio Arai, Tokyo; Kazushi Sugiura, Kanagawa; Ichiro Takayama, Kanagawa; Yukio Yamauchi, Kanagawa; Isamu Kobori, Chiba; Mitsufumi Codama; Naoya Sakamoto, both of Kanagawa, all of Japan

[73] Assignees: TKD Corporation, Tokyo; Semiconductor Energy Laboratory Co., Ltd., Kanagawa, both of Japan

[21] Appl. No.: 609,433

[22] Filed: Mar. 1, 1996

[30] Foreign Application Priority Data

Mar. 3, 1995  [JP]  Japan ..................... 7-043748

[51] Int. Cl.[6] ............ H01L 29/04; H01L 29/76
[52] U.S. Cl. .................. 257/57; 257/60; 257/59; 257/266; 257/331; 257/365; 257/366
[58] Field of Search .............. 257/57, 60, 213, 257/135, 136, 263, 264, 265, 266, 267, 302, 328, 314, 329, 330, 332, 331, 333, 334, 315, 59, 365, 366

[56] References Cited

U.S. PATENT DOCUMENTS 5,495,119  2/1996  Ikeuchi ..................... 257/365

FOREIGN PATENT DOCUMENTS 60-58676  4/1985  Japan .

Primary Examiner—Carl W. Whitehead
Attorney, Agent, or Firm—Nikaido Marmelstein Murray & Oram, LLP

[57] ABSTRACT

A thin film transistor which includes an insulation base, first and second gate electrodes, first and second insulation layers, an active layer of semiconductor material, a source electrode and a drain electrode, in which a lateral length of the first gate electrode is narrower than a lateral length of the second gate electrode. Also, the first gate is electrically insulated from the active layer of semiconductor material by the first insulation layer so that the drain current saturates in a high drain voltage region.

10 Claims, 5 Drawing Sheets

THIN FILM TRANSISTOR FOR CONTROLLING A DEVICE SUCH AS A LIQUID CRYSTAL CELL OR ELECTROLUMINESCENT ELEMENT

FIELD OF THE INVENTION

The present invention relates to a thin film transistor used for controlling for example a liquid crystal cell or an electroluminescent element.

DESCRIPTION OF THE RELATED ART

Conventional thin film transistor has the structure as shown in a sectional view of FIG. 1. Namely, on a substrate 11 such as for example a glass substrate, a quartz substrate or a monolithic silicon substrate, a $SiO_2$ film layer 12 is formed. An active silicon layer 15 is formed on a partial region of the $SiO_2$ film layer 12. On a central region of the active silicon layer 15, a gate oxide layer 16 is formed. A gate electrode 17 is formed on the gate oxide layer 16. A gate conductive lead 18 electrically connected to the gate electrode 17, a drain electrode and conductive lead 19 electrically coupled to a drain region formed in the active silicon layer 15 and a source electrode and conductive lead 20 electrically coupled to a source region formed in the active silicon layer 15 are also formed. Furthermore, an interlayer insulation layer 22 of $SiO_2$ is formed to cover the above-mentioned layers.

FIG. 2 shows a $V_D$–$I_D$ (drain voltage–drain current) characteristic of this conventional thin film transistor shown in FIG. 1. As can be noted from this figure, the drain current $I_D$ does not saturate in a high $V_D$ region but increases in response to increasing of the drain voltage $V_D$ within a high drain voltage region. Accordingly, it is difficult to operate the conventional thin film transistor in the high drain voltage region.

SUMMARY OF THE INVENTION

It is therefore an object of the present invention to provide a thin film transistor with a saturated output current characteristic in a high output voltage region.

According to the present invention, a thin film transistor includes an insulation base, a first gate electrode formed on the insulation base, a first insulation layer formed on the first gate electrode and on the insulation base so as to cover the first gate electrode, an active layer of semiconductor material, formed on the first insulation layer and on the insulation base, a source region and a drain region being formed in the active layer, a source electrode electrically coupled to the source region formed in the active layer, a drain electrode electrically coupled to the drain region formed in the active layer, a second insulation layer formed on the active layer, and a second gate electrode formed on the second insulation layer, the second gate electrode being disposed in the opposite side of the first gate electrode with respect to the active layer, a lateral length (length along a channel formed between the drain and source regions) of the first gate electrode being narrower than a lateral length (length along a channel formed between the drain and source regions) of the second gate electrode.

Thus, the thin film transistor according to the present invention has a combined structure of a general thin film transistor substantially consisting of the second gate electrode and the active semiconductor material layer and of a narrow gate thin film transistor substantially consisting of the first gate electrode and the active semiconductor material layer. The narrow gate thin film transistor will operate as a thin film transistor provided with an offset structure. Thus, the both side end portions of the active semiconductor material layer will have high resistivity. As a result, the drain current will not increase even when the drain voltage is increased causing the $V_D$–$I_D$ characteristics thereof to be characteristics wherein $I_D$ saturates in a high $V_D$ region with keeping operation characteristics of the general thin film transistor.

Since the drain current can be kept constant even when the drive voltage of the transistor varies at the saturated region, stable drive control can be expected under a condition where the supply voltage is fluctuated.

It is preferred that the insulation base includes a substrate and a third insulation layer formed directly on the substrate.

It is also preferred that the transistor further includes conductive leads electrically connected to the first gate electrode, the second gate electrode, the source electrode and the drain electrode, respectively.

It is preferred that the transistor further includes an interlayer insulation layer to cover the conductive leads, the second gate electrode and the active layer.

The second electrode may be electrically connected to a conductive portion kept at a fixed potential less than a threshold potential or the source electrode.

Preferably, the active layer of semiconductor material is made of active silicon material.

Preferably, the first and second gate electrodes are made of polysilicon material.

Preferably, the first and second insulation layers are made of $SiO_2$ material.

Also, preferably, the conductive leads electrically connected to the first gate electrode, the second gate electrode, the source electrode and the drain electrode are made of aluminum material.

Further objects and advantages of the present invention will be apparent from the following description of the preferred embodiments of the invention as illustrated in the accompanying drawings.

DESCRIPTION OF THE PREFERRED EMBODIMENT

Figure 1:
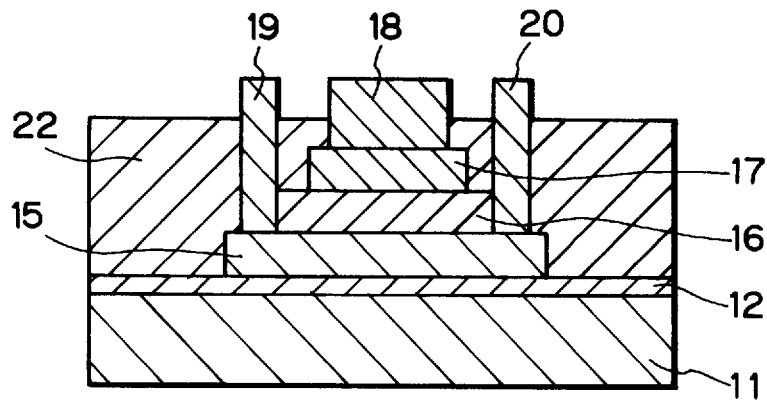
FIG. 1 shows a sectional view of the conventional thin film transistor already described.
Figure 2:
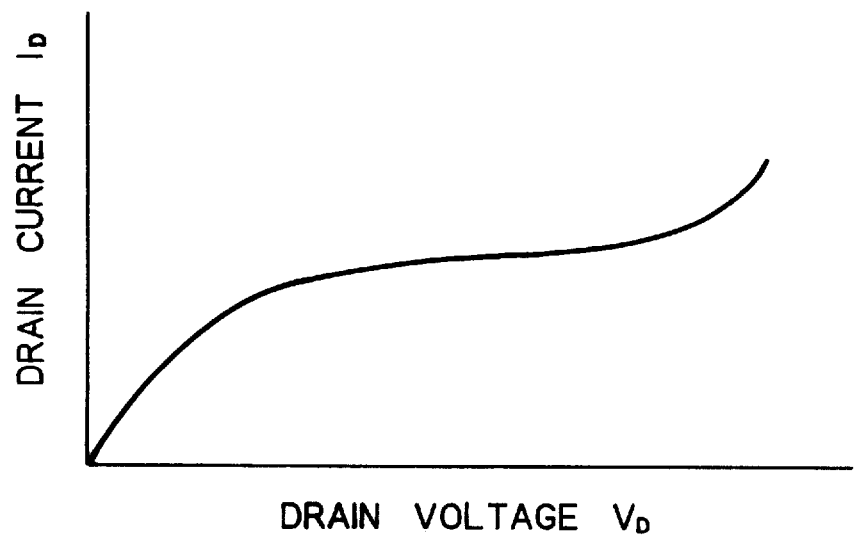
FIG. 2 shows a $V_D$–$I_D$ characteristic of the conventional thin film transistor shown in FIG. 1.
Figure 3:
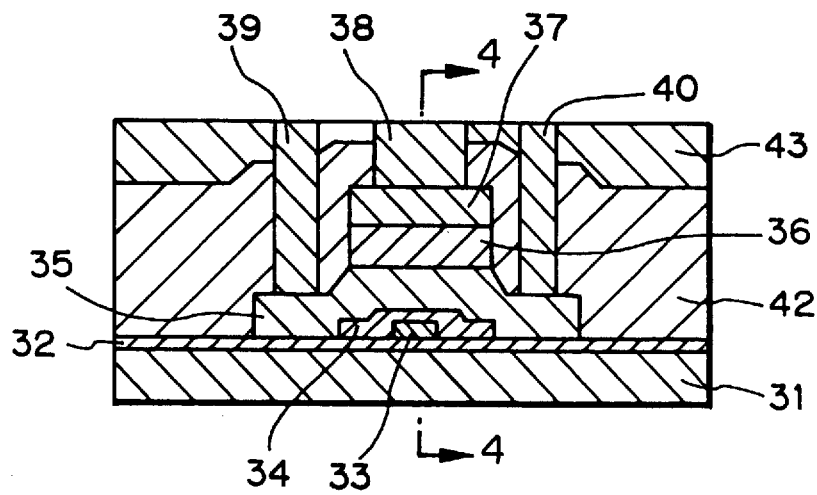
FIG. 3 shows a sectional view of a preferred embodiment of a thin film transistor according to the present invention.
Figure 4:
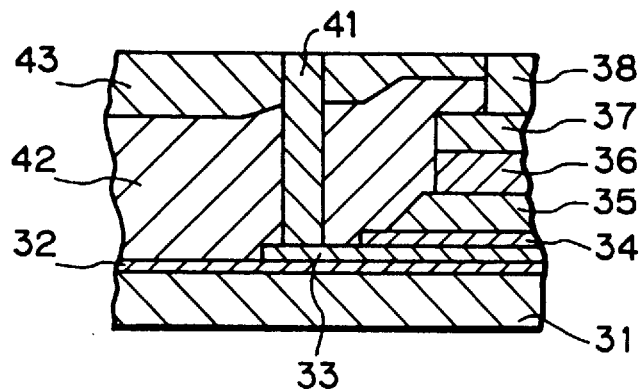
FIG. 4 shows a sectional view along line 4—4 of FIG. 3.

In FIG. 3 which shows a sectional view of a preferred embodiment of a thin film transistor according to the present invention and in FIG. 4 which shows a sectional view along line 4—4 of FIG. 3, a reference numeral 31 denotes a substrate such as an alumina substrate, a quartz substrate, a glass substrate or silicon substrate. On the substrate 31, a SiO$_2$ film layer 32 is formed. A bottom gate electrode 33 is formed on a partial region of the SiO$_2$ film layer 32. This bottom gate electrode 33 is partially covered by a SiO$_2$ film layer 34. An active silicon layer 35 is formed on a partial region of the SiO$_2$ film layer 32 and on the SiO$_2$ film layer 34. On a central region of the active silicon layer 35, a gate oxide layer 36 is formed. A top gate electrode 37 is laminated on the gate oxide layer 36.

A top gate conductive lead 38 electrically connected to the top gate electrode 37, a drain electrode and conductive lead 39 electrically coupled to a drain region formed in the active silicon layer 35, a source electrode and conductive lead 40 electrically coupled to a source region formed in the active silicon layer 35 and a bottom gate conductive lead 41 connected to the bottom gate electrode 33 are also formed. Furthermore, an interlayer insulation layer 42 of SiO$_2$ and a protection layer 43 are formed to cover the above-mentioned layers. The bottom gate layer 33 is formed so that its lateral length (length along a channel formed between the drain and source regions) is narrower than that of the top gate electrode 37.

Figure 5:
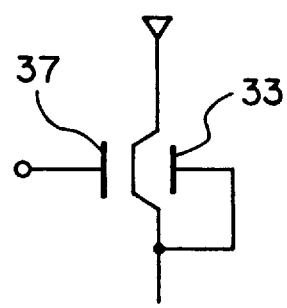
FIG. 5 shows a circuit diagram for operating the thin film transistor shown in FIG. 3.
Figure 6:
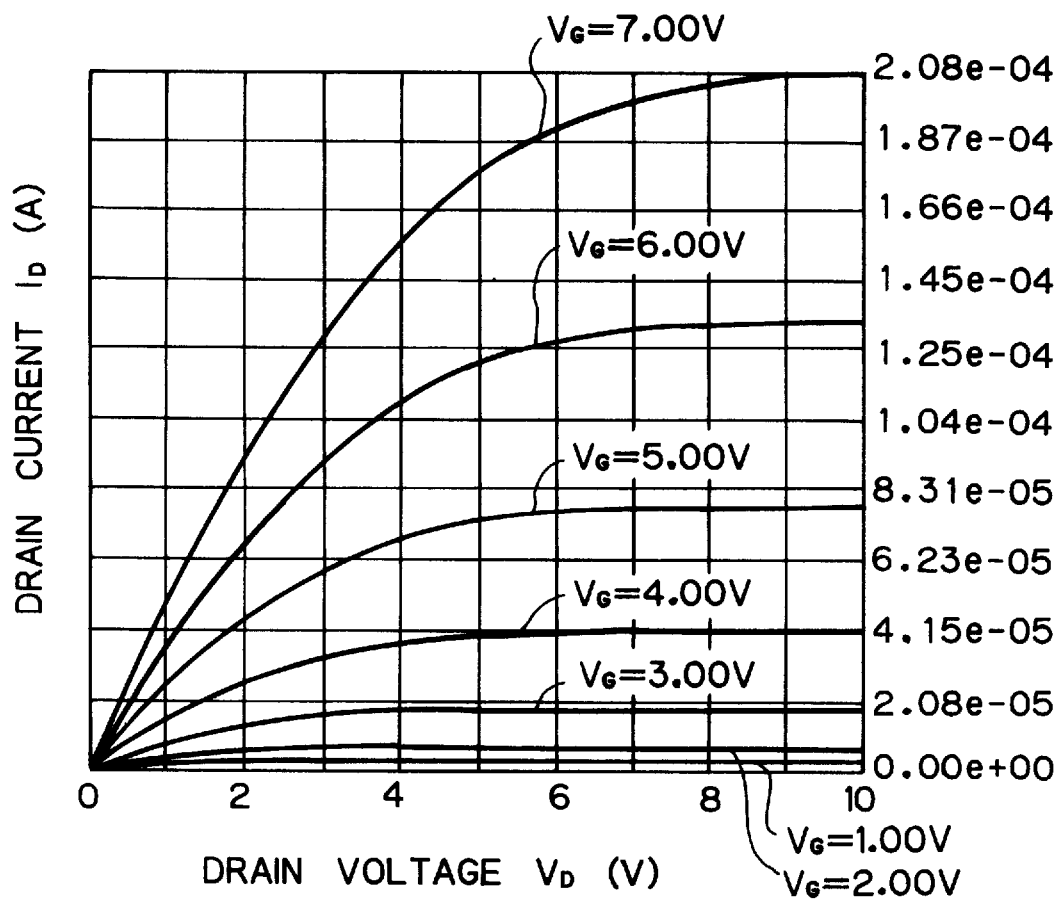
FIG. 6 shows a $V_D$–$I_D$ characteristics of the thin film transistor shown in FIG. 3.

The bottom gate electrode 33 will be electrically connected via the conductive lead 41 to a conductive portion (not shown) kept at a fixed potential less than a threshold potential of the transistor for example the source electrode as shown in FIG. 5 so as to suppress possible noise. This connection of the bottom gate electrode 33 may be performed by means of an external connection lead or an internal connection lead (not shown). Thus, a $V_D$13 $I_D$ characteristics of this thin film transistor will be as shown in FIG. 6, wherein the gate voltage $V_G$ applied to the top gate electrode 37 is varied as a parameter from $V_G$=1.00 V to 7.00 V. As will be apparent from this figure, the thin film transistor of this embodiment has $V_D$-$I_D$ characteristics wherein $I_D$ saturates in a high $V_D$ region.

It will be understood that the thin film transistor of this embodiment has a combined structure of a general thin film transistor substantially consisting of the top gate electrode 37 and the active silicon layer 35 and a narrow gate thin film transistor substantially consisting of the bottom gate electrode 33 and the active silicon layer 35. The narrow gate thin film transistor will operate as a thin film transistor provided with an offset structure. Thus, the both side end portions of the active silicon layer 35 will have high resistivity. As a result, the drain current will not increase even when the drain voltage is increased causing the $V_D$-$I_D$ characteristics thereof to be characteristics wherein $I_D$ saturates in a high $V_D$ region with keeping operation characteristics of the general thin film transistor.

Since the drain current can be kept constant even when the drive voltage of the transistor varies at the saturated region, stable drive control can be expected under a condition where the supply voltage is fluctuated.

Referring to FIGS. 7a to 7h, manufacturing processes of the thin film transistor of this embodiment will be described in detail.

Figure 7A:
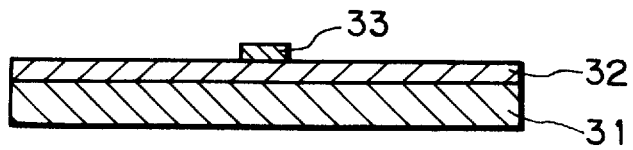
FIGS. 7a to 7h show sectional views of manufacturing processes of the thin film transistor shown in FIG. 3.

As shown in FIG. 7a, on a substrate 31 such as an alumina substrate, a quartz substrate, a glass substrate or silicon substrate, a SiO$_2$ film layer 32 with a thickness of about 1000 Angstrom is deposited by for example a sputtering method. Then, on the SiO$_2$ film layer 32, an amorphous silicon layer with a thickness of about 2000 Angstrom is deposited by a CVD (Chemical Vapor Deposition) method. A condition of this CVD is for example as follows:

| SiH$_4$ gas | 100 SCCM |
|---|---|
| Pressure | 0.3 Torr |
| Cl$_2$ gas | 1–100 SCCM |
| Temperature | 550° C. |

Then, the amorphous silicon layer is annealed to form a polysilicon layer (solid-phase growth). A condition of the solid-phase growth is for example as follows:

| N$_2$ | 1 SLM |
|---|---|
| Temperature | 600° C. |
| Processing time | 5–20 Hours |

Thereafter, patterning process of the polysilicon layer is performed to form a bottom gate electrode 33.

Figure 7B:
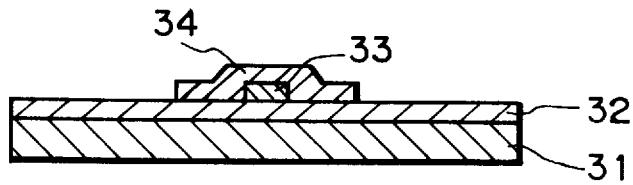

Then, as shown in FIG. 7b, this bottom gate electrode 33 is covered by a SiO$_2$ film layer 34 with a thickness of about 1000 Angstrom. This SiO$_2$ film layer 34 is deposited by a sputtering method using a mask.

On the SiO$_2$ film layers 32 and 34, an amorphous silicon layer with a thickness of about 4000 Angstrom is deposited by a CVD method similar to the above-mentioned CVD method. Namely, a condition of this CVD is for example as follows:

| SiH$_4$ gas | 100 SCCM |
|---|---|
| Pressure | 0.3 Torr |
| Cl$_2$ gas | 1–100 SCCM |
| Temperature | 550° C. |

Then, the amorphous silicon layer is annealed to form a polysilicon layer (solid-phase growth). A condition of the solid-phase growth is for example as follows:

| N$_2$ | 1 SLM |
|---|---|
| Temperature | 600° C. |
| Processing time | 5–20 Hours |

Figure 7C:
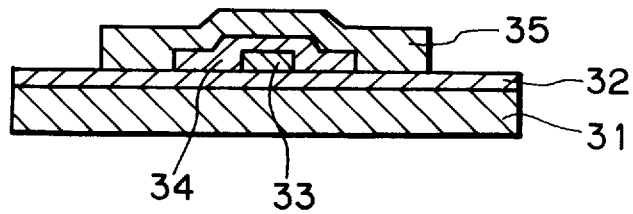

Thereafter, patterning process of the polysilicon layer is performed to form an active silicon layer 35 as shown in FIG. 7c.

Figure 7D:
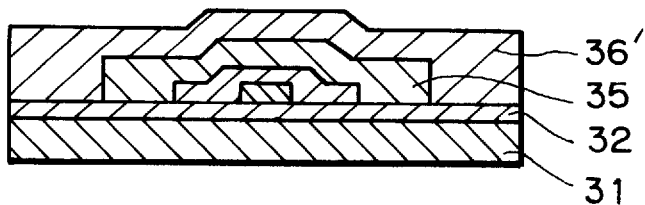

Then, as shown in FIG. 7d, a SiO$_2$ layer 36' with a thickness of about 4000 Angstrom, which will be formed as a gate oxide layer 36, is deposited on the active silicon layer 35 and the SiO$_2$ film layer 32 by for example a plasma CVD method. A condition of this plasma CVD is for example as follows:

| Power | 50 W |
|---|---|
| TEOS (Tetraethoxysilane) gas | 50 SCCM |
| O$_2$ | 500 SCCM |
| Pressure | 0.1–0.5 Torr |
| Temperature | 350° C. |

On the SiO$_2$ layer 36' an amorphous silicon layer with a thickness of about 4000 Angstrom is deposited by a CVD method similar to the above-mentioned CVD method. A condition of this CVD is for example as follows:

| | |
|---|---|
| SiH₄ gas | 100 SCCM |
| Pressure | 0.3 Torr |
| Cl₂ gas | 1–100 SCCM |
| Temperature | 550° C. |

Figure 7E:
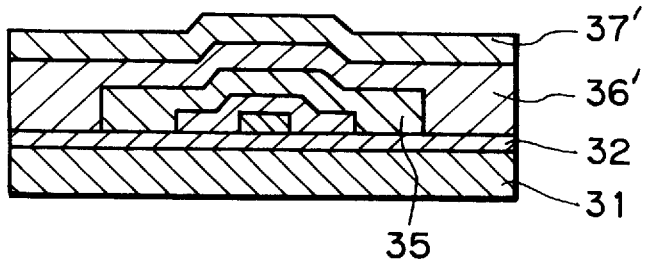

Then, the amorphous silicon layer is annealed to form a polysilicon layer 37' (solid-phase growth) as shown in FIG. 7e. A condition of the solid-phase growth is for example as follows:

| | |
|---|---|
| N₂ | 1 SLM |
| Temperature | 600° C. |
| Processing time | 5–20 Hours |

Thereafter, patterning processes, using a dry etching method for example, of the SiO₂ layer 36' and the polysilicon layer 37' are performed to form the gate oxide layer 36 and a top gate electrode 37, respectively.

Figure 7F:
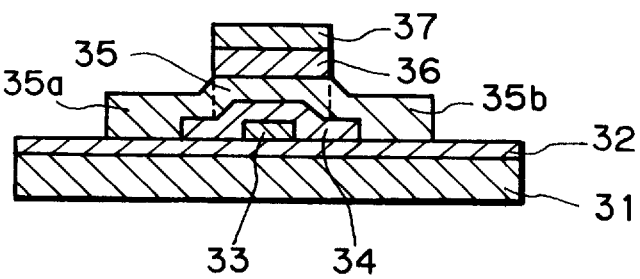

Then, as shown in FIG. 7f, a source region 35a and a drain region 35b are formed in the active silicon layer 35 by an ion doping method. In this embodiment, dopant is for example P and the top gate electrode 37 is used as a mask for the doping process. The dopant is activated by heating at about 400° C. for about 5 hours in N₂ atmosphere. Then, the layers is hydrogenated by heating at about 400° C. for about 30 minutes in H₂ atmosphere so as to decrease the defect level density in the semiconductor material.

Figure 7G:
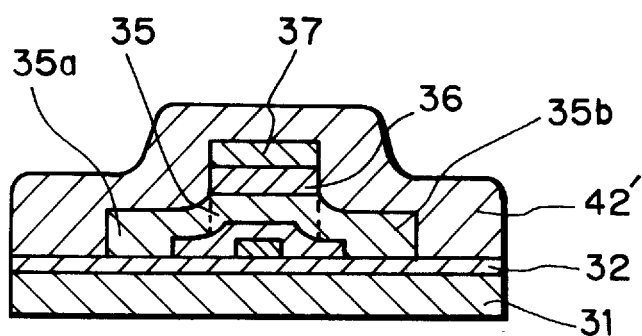

Then, as shown in FIG. 7g, a SiO₂ layer 42' with a thickness of about 4000 Angstrom, which will be formed as an interlayer insulation layer 42, is deposited on the gate electrode 37, the active silicon layer 35 and the SiO₂ film layer 32 by for example a plasma CVD method, a CVD method or a sputtering method. A condition of the plasma CVD is for example as follows:

| | |
|---|---|
| Power | 50–300 W |
| TEOS gas | 10–50 SCCM |
| O₂ | 500 SCCM |
| Pressure | 0.1–0.5 Torr |
| Temperature | 350° C. |

Figure 7H:
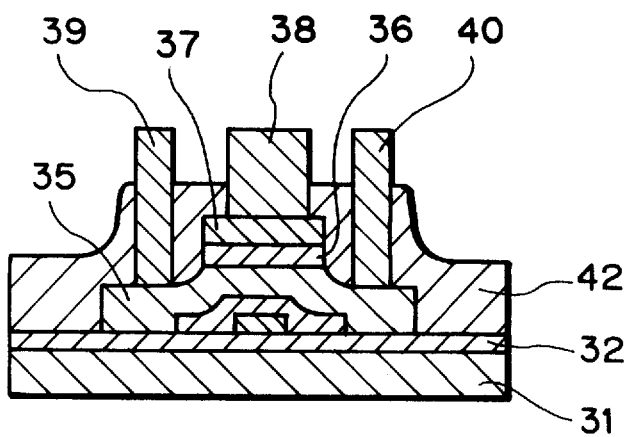

Then, contact holes are formed by etching the SiO₂ layer 42' and thereafter conductive material such as aluminum (Al) is vapor-deposited. By performing a patterning process of this deposited conductive material layer, a top gate conductive lead 38 electrically connected to the top gate electrode 37, a drain electrode and conductive lead 39 electrically coupled to the drain region 35b formed in the active silicon layer 35, a source electrode and conductive lead 40 electrically coupled to the source region 35a formed in the active silicon layer 35, a bottom gate conductive lead 41 (FIG. 4) electrically connected to the bottom gate electrode 33 are formed as shown in FIG. 7h. Then, a protection layer 43 made of such as PSG (Phospho Silicate Glass) is formed on the interlayer insulation layer 42 of SiO₂ as shown in FIGS. 3 and 4.

Accordingly, a narrow gate type thin film transistor in which the bottom gate layer 33 has a lateral length (length along a channel formed between the drain and source regions) narrower than that of the top gate electrode 37 is manufactured.

Many widely different embodiments of the present invention may be constructed without departing from the spirit and scope of the present invention. It should be understood that the present invention is not limited to the specific embodiments described in the specification, except as defined in the appended claims.

What is claimed is:

1. A thin film transistor comprising:

an insulation base;

a first gate electrode formed on said insulation base;

a first insulation layer formed on said first gate electrode and on said insulation base so as to cover said first gate electrode;

an active layer of semiconductor material, formed on said first insulation layer and on said insulation base, a source region and a drain region being formed in said active layer;

a source electrode electrically coupled to said source region formed in said active layer;

a drain electrode electrically coupled to said drain region formed in said active layer;

a second insulation layer formed on said active layer; and a second gate electrode formed on said second insulation layer, said second gate electrode being disposed in the opposite side of said first gate electrode with respect to said active layer, wherein a lateral length of said first gate electrode is narrower than a lateral length of said second gate electrode, and said first insulation layer electrically insulates said first gate electrode from said active layer of semiconductor material so that drain current saturates in a high drain voltage region.

2. The transistor as claimed in claim 1, wherein said insulation base comprises a substrate and a third insulation layer formed directly on said substrate.

3. The transistor as claimed in claim 1, wherein said transistor further comprises conductive leads electrically connected to said first gate electrode, said second gate electrode, said source electrode and said drain electrode, respectively.

4. The transistor as claimed in claim 3, wherein said transistor further comprises an interlayer insulation layer to cover said conductive leads, said second gate electrode and said active layer.

5. The transistor as claimed in claim 1, wherein said second electrode is electrically connected to a conductive portion kept at a fixed potential less than a threshold potential.

6. The transistor as claimed in claim 1, wherein said second electrode is electrically connected to said source electrode.

7. The transistor as claimed in claim 1, wherein said active layer of semiconductor material is made of active silicon material.

8. The transistor as claimed in claim 7, wherein said first and second gate electrodes are made of polysilicon material.

9. The transistor as claimed in claim 7, wherein said first and second insulation layers are made of SiO₂ material.

10. The transistor as claimed in claim 3, wherein said conductive leads electrically connected to said first gate electrode, said second gate electrode, said source electrode and said drain electrode are made of aluminum material.

* * * * *

UNITED STATES PATENT AND TRADEMARK OFFICE
CERTIFICATE OF CORRECTION

PATENT NO.   :   5,821,560

DATED        :   October 13, 1998

INVENTOR(S)  :   Arai et al.

It is certified that error appears in the above-identified patent and that said Letters Patent is hereby corrected as shown below:

On the title page,
    Item [73], line 1, delete "TKD" insert therefor -- TDK --

Signed and Sealed this

Thirtieth Day of March, 1999

Attest:

Q. TODD DICKINSON

*Attesting Officer*   Acting Commissioner of Patents and Trademarks